United States Patent
Lobsinger et al.

(10) Patent No.: US 6,900,525 B2
(45) Date of Patent: May 31, 2005

(54) SEMICONDUCTOR PACKAGE HAVING FILLER METAL OF GOLD/SILVER/COPPER ALLOY

(75) Inventors: Joshua David Lobsinger, San Diego, CA (US); Michael John Shane, Carlsbad, CA (US); Ronaldo Francisco Hernandez Brosas, San Diego, CA (US)

(73) Assignee: Kyocera America, Inc., San Diego, CA (US)

( * ) Notice: Subject to any disclaimer, the term of this patent is extended or adjusted under 35 U.S.C. 154(b) by 0 days.

(21) Appl. No.: 10/442,549

(22) Filed: May 21, 2003

(65) Prior Publication Data

US 2004/0232529 A1 Nov. 25, 2004

(51) Int. Cl.[7] .............................................. H01L 23/02
(52) U.S. Cl. ...................... 257/678; 257/734; 257/777
(58) Field of Search ......................... 257/777, 678–680, 257/732, 728

(56) References Cited

U.S. PATENT DOCUMENTS

| | | | |
|---|---|---|---|
| 4,325,051 A | 4/1982 | Rodriguez | |
| 4,431,983 A | 2/1984 | Rodriguez | |
| 4,487,638 A | * 12/1984 | Hoge ........................... 148/24 |
| 4,821,148 A | 4/1989 | Kobayashi et al. | |
| 4,897,508 A | 1/1990 | Mahulikar et al. | |
| 5,043,534 A | 8/1991 | Mahulikar et al. | |
| 5,164,885 A | 11/1992 | Drye et al. | |
| 5,313,365 A | 5/1994 | Pennisi et al. | |
| 5,360,942 A | 11/1994 | Hoffman et al. | |
| 5,428,501 A | 6/1995 | Bruder | |
| 5,569,958 A | 10/1996 | Bloom | |
| 5,757,611 A | 5/1998 | Gurkovich et al. | |
| 5,761,048 A | 6/1998 | Trabucco | |
| 5,808,870 A | 9/1998 | Chiu | |
| 5,825,084 A | * 10/1998 | Lau et al. ..................... 257/700 |
| 6,027,791 A | * 2/2000 | Higashi et al. .............. 428/209 |
| 6,174,606 B1 | 1/2001 | Brusic et al. | |
| 6,198,634 B1 | 3/2001 | Armezzani et al. | |
| 6,214,152 B1 | 4/2001 | Ross et al. | |
| 6,307,755 B1 | 10/2001 | Williams et al. | |
| 6,462,413 B1 | 10/2002 | Polese et al. | |
| 2002/0005247 A1 | * 1/2002 | Graham et al. .............. 156/291 |
| 2003/0038362 A1 | * 2/2003 | Nomura ....................... 257/706 |
| 2003/0201524 A1 | * 10/2003 | Murakami et al. .......... 257/686 |

* cited by examiner

*Primary Examiner*—Hoai Pham
*Assistant Examiner*—Nathan W. Ha
(74) *Attorney, Agent, or Firm*—Hogan & Hartson, LLP

(57) ABSTRACT

A semiconductor package to which a potential difference is applied has two or more of the components thereof bound together using a filler metal. The filler metal is a solid solution structure in which the metallic components are atomically dispersed, and may comprise an alloy of gold, silver and copper. A preferred form of the filler metal comprises 60Au20Ag20Cu. Such filler metals in accordance with the invention provide the advantages of silver-based filler metals without the silver migration that leads to eventual shorting of the semiconductor package. When water condenses to form a continuous layer thereof within the semiconductor package due to moisture seeping into the package and temperature changes, the silver within the filler metal does not ionize, and therefore a buildup of silver deposits and eventual shorting of the package does not occur.

6 Claims, 6 Drawing Sheets

SEMICONDUCTOR PACKAGE HAVING FILLER METAL OF GOLD/SILVER/COPPER ALLOY

BACKGROUND OF THE INVENTION

1. Field of the Invention

The present invention relates to semiconductor packages, and more particularly to packages in which the various parts such as the flange, the window frame and the leads are joined together using a filler metal.

2. History of the Prior Art

It is known in the art to provide semiconductor packages in which one or more semiconductor dies are mounted on a heatsink flange within an opening in a window frame which mounts and insulates a plurality of leads. The dies may be of the LDMOS (lateral diffusion metal oxide semiconductor) type and the package of the type for packaging LDMOS power transistors. The window frame serves to mount the leads on the semiconductor package and insulate the leads from the heatsink flange and other portions of the package. The window frame has an opening therein which surrounds the semiconductor dies. The dies are electrically coupled to the leads such as by wire bonds.

In semiconductor packages of the type described, the component parts thereof, including the flange, the window frame and the leads, are typically joined together using a filler metal. Typically, such filler metals are silver based. The filler metal acts to bind the flange to the window frame and the leads to the window frame. An example of a silver-based filler metal commonly used to bind together the parts of the semiconductor package is 72Ag28Cu (CuSil).

Silver-based filler metals such as CuSil are effective in binding the flange to the window frame and the leads to the window frame. Such metals can withstand the high temperatures and other conditions associated with the manufacture of the semiconductor package, and continue to bind the parts together during subsequent use of the package. However, problems may occur during subsequent use of the semiconductor package, particularly where the package is not contained within a hermetically sealed enclosure or with a hermetic lid. The filler metal provides an exposed silver source. Moisture can seep into the package and condense along the dielectric surface of the window frame between the filler metal and the flange and the leads. With a potential difference applied between the negative flange and the positive leads, silver migration occurs. Eventually, such silver migration may bridge and create an electrical short between the positive leads and the negative flange. If a continuous layer of moisture forms between the leads and the flange, ionized silver travels along the condensed water covering the dielectric window frame and deposits at the flange in pure metal form. Eventually, the silver deposits bridge the flange and the leads to create an electrical short.

Silver migration has long been a problem for the electronics industry, often requiring changes to current and future product designs. One way to ensure that silver migration does not occur is to use a filler metal which contains no silver. Other alternatives involve the use of adhesives, conformal coatings, and additives such as Pd, Y and the like. However, adhesives and conformal coatings are usually unable to survive the high processing temperatures of 300° C. or more. Filler metals or additives which do not contain silver tend to have less than desirable properties, such as increased brittleness, high processing temperatures, and non-uniform wetting.

For this reason, CuSil is still preferred as the filler metal for most applications. Such material provides ideal electrical conductivity as well as desirable mechanical properties such as high strength, high ductility and smooth joints. However, silver migration continues to be a problem with such material.

SUMMARY OF THE INVENTION

The present invention provides improved electronic packages in which silver migration is not a problem. The parts of the packages are joined together by a filler metal which is silver-based and yet which does not experience silver migration. The filler metal provides essentially the same advantages as the commonly used CuSil, but without the attendant problem of silver migration.

In accordance with the invention, the filler metal is comprised of an alloy which includes gold, silver and copper. The alloy is a solid solution structure in which the gold, silver and copper are atomically dispersed. As a result, the silver does not migrate so as to form deposits which eventually short the package. A preferred form of the filler metal in accordance with the invention comprises 60Au20Ag20Cu. Such alloy has virtually no silver migration, even in the presence of operating conditions which typically provide silver migration when other silver-based filler metals are used.

One form of semiconductor package in accordance with the invention includes a heatsink flange having a surface, a window frame having an opening therein between opposite first and second surfaces thereof, and a plurality of leads. The first surface of the window frame is coupled to the surface of the flange by a filler alloy. The plurality of leads are coupled to the second surface of the window frame by the filler alloy. At least one semiconductor die is mounted on the flange within the opening in the window frame and is wire bonded to the plurality of leads. A lid is mounted on the package so that a peripheral edge thereof is coupled to the leads and to the second surface of the window frame opposite the flange, by epoxy. The filler metal comprises 60Au20Ag20Cu. During operation of the semiconductor package, a potential difference is applied between the positive leads and the negative flange, so that such potential difference exists across the dielectric window frame. With moisture present, such moisture may migrate through the epoxy seal between the lid and the leads and window frame and condense within the semiconductor package in response to changing temperatures. The condensed moisture may eventually form a layer extending from the leads along the surface of the dielectric window frame to the flange. Nevertheless, the solid solution structure of the filler metal with its atomically dispersed gold, silver and copper prevents silver migration from occurring.

BRIEF DESCRIPTION OF THE DRAWINGS

A detailed description of preferred embodiments of the invention will be made with reference to the accompanying drawings, in which.

DETAILED DESCRIPTION OF THE PREFERRED EMBODIMENTS

Figure 1:
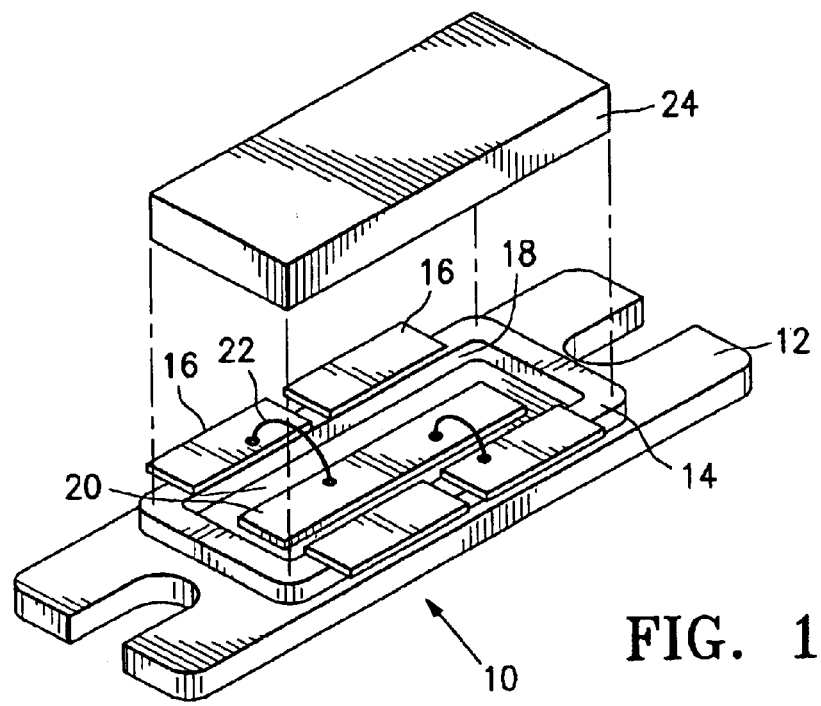
FIG. 1 is a perspective view of a semiconductor package in accordance with the invention, with the lid thereof removed to show interior details.

FIG. 1 shows a semiconductor package 10 which is of the type that advantageously utilizes filler metal alloys in accordance with the invention. The semiconductor package 10 of FIG. 1 includes a heatsink flange 12 of elongated, flat, generally planar configuration, having a window frame 14 mounted thereon. A plurality of leads 16 are mounted on the window frame 14 opposite the flange 12. The window frame 14 has an opening 18 therein exposing a portion of the flange 12. A semiconductor die 20 is mounted on the flange 12 within the opening 18, and is electrically coupled to the lead 16. Such electrical coupling may be accomplished with wire bonds 22, two of which are shown in FIG. 1 for illustration. A single die 20 is shown for purposes of illustration, and a plurality of dies may be mounted within the opening 18 if desired. A lid 24, which is mounted over the leads 16 and the window frame 14 so as to enclose the opening 18 and the included die 20, is shown spaced apart from the rest of the structure in FIG. 1 to show the interior details thereof.

Figure 2:
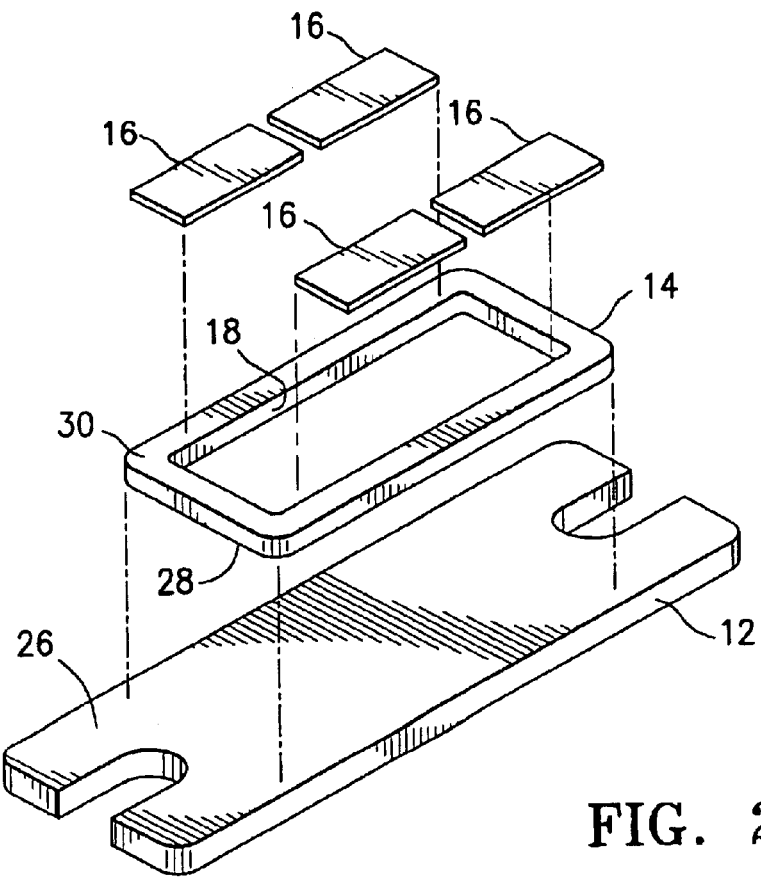
FIG. 2 is a perspective, exploded view of the flange, the window frame and the leads of the semiconductor package of FIG. 1.

FIG. 2 is an exploded view of several of the components of the semiconductor package 10 of FIG. 1. The components include the flange 12 which is of relatively thin, generally planar configuration and which has a relatively flat upper surface 26. The opening 18 extends through the relatively thin window frame 14 between opposite lower and upper surfaces 28 and 30 thereof. The window frame 14 is mounted on the flange 12 by joining the lower surface 28 thereof to the upper surface 26 of the flange 12. The leads 16 are mounted on the upper surface 30 of the window frame 14, opposite the flange 12.

Figure 3:
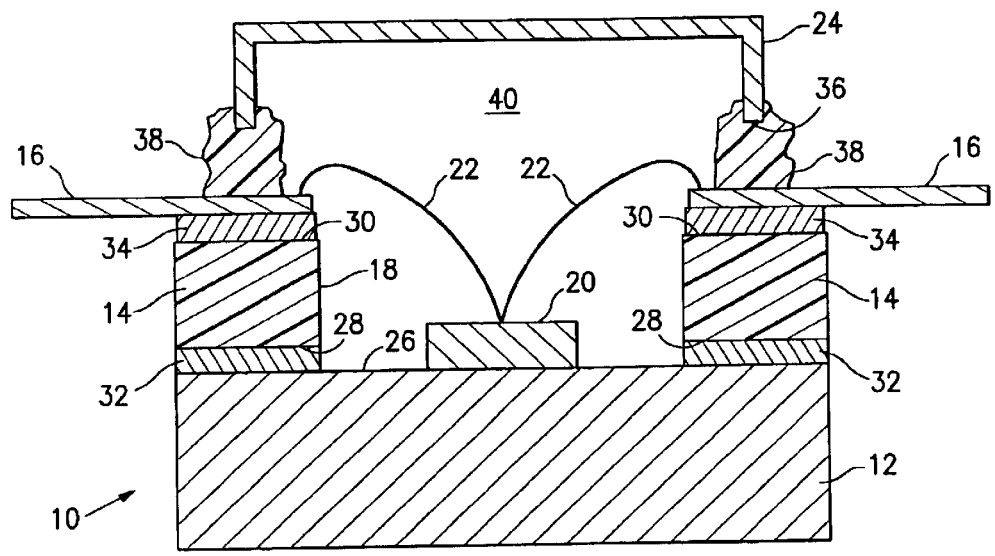
FIG. 3 is a side sectional view of the semiconductor package of FIG. 1.

FIG. 3 is a side cross-sectional view of the semiconductor package 10 of FIG. 1. As shown in FIG. 3, the window frame 14 is coupled to the flange 12 by a quantity of filler metal 32. The filler metal 32 extends between the lower surface 28 of the window frame 14 and the upper surface 26 of the flange 12 to bind the two together. As also shown in FIG. 3, the leads 16 are coupled to the window frame 14 by a quantity of filler metal 34. The filler metal 34 extends between and binds the leads 16 to the upper surface 26 of the window frame 14. The filler metals 32 and 34 can be of like composition or of other compositions. The lid 24 is an enclosing structure having a lower peripheral edge 36 thereof. The lower peripheral edge 36 of the lid 24 is coupled to the leads 16 and the upper surface 26 of the window frame 14 by a quantity of epoxy 38. The lid 24 and the epoxy 38 provide a standard non-hermetic seal over the semiconductor package 10.

Figure 4:
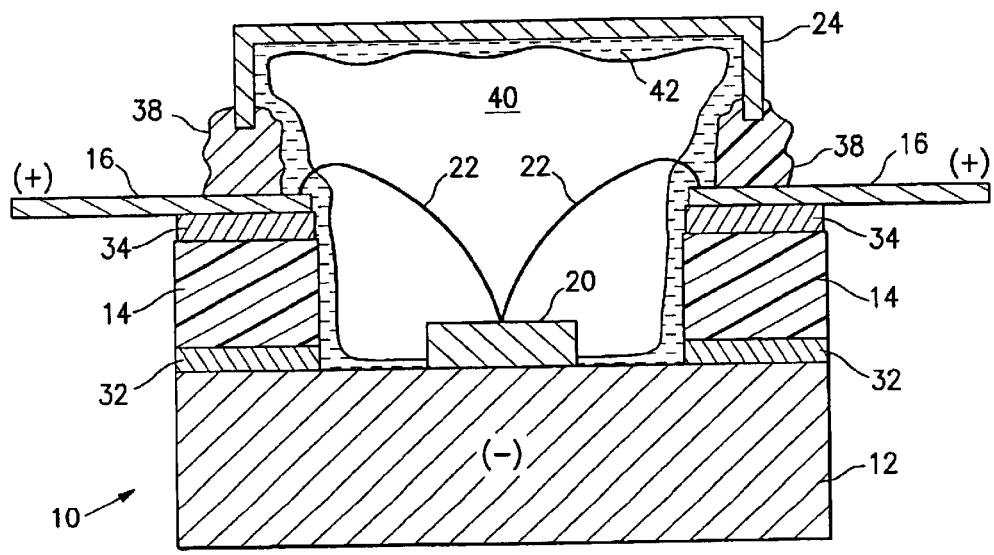
FIG. 4 is a side sectional view similar to that of FIG. 3 but showing the manner in which moisture can condense in the interior of the semiconductor package during use thereof.

During use of the semiconductor package 10, the positive terminal of a power source is coupled to the leads 16 and the negative terminal of the power source is coupled to the flange 12. The semiconductor package 10 is typically located in an atmosphere which contains some humidity. The moisture from the atmosphere penetrates the epoxy 38 to bring the humidity within a cavity 40 inside the semiconductor package 10 into equilibrium with the outside atmosphere. Because the moisture is transmitted slowly through the epoxy 38, a rapid decrease in temperature will force the moisture in the cavity 40 to condense along the inside surface of the cavity 40. This is shown in FIG. 4, which illustrates the condensed layer of moisture 42.

In the case of prior art semiconductor packages 10 where the filler metals 32 and 34 are comprised of a silver/copper alloy such as CuSil (72Ag28Cu), the condensed moisture 42 ionizes any exposed silver and provides a vehicle along which the ionized silver travels. Ionized silver is drawn to the negative potential at the cathode formed by the flange 12.

Figure 5:
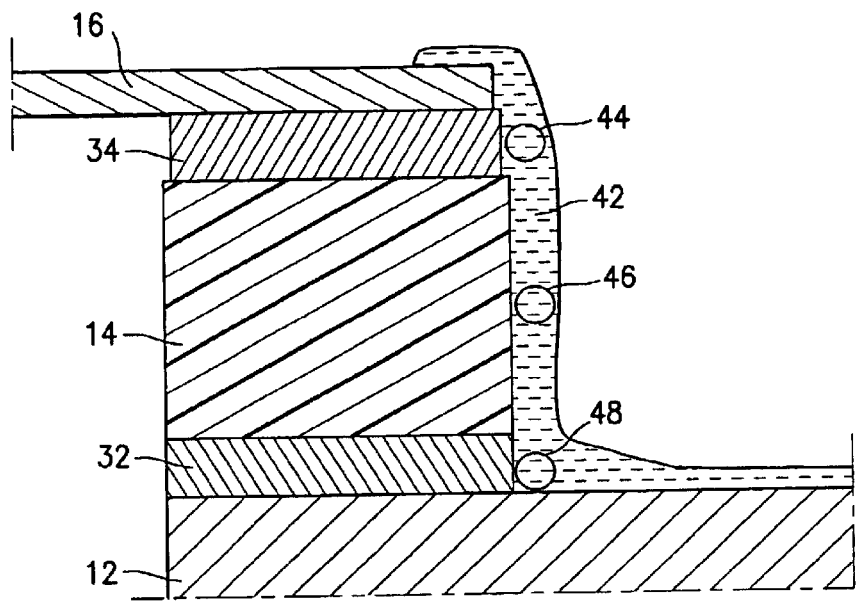
FIG. 5 is an enlarged view of a portion of the side sectional view of FIG. 4 and showing in greater detail the manner in which the condensed moisture can extend across the window frame between the leads and the flange.
Figure 6:
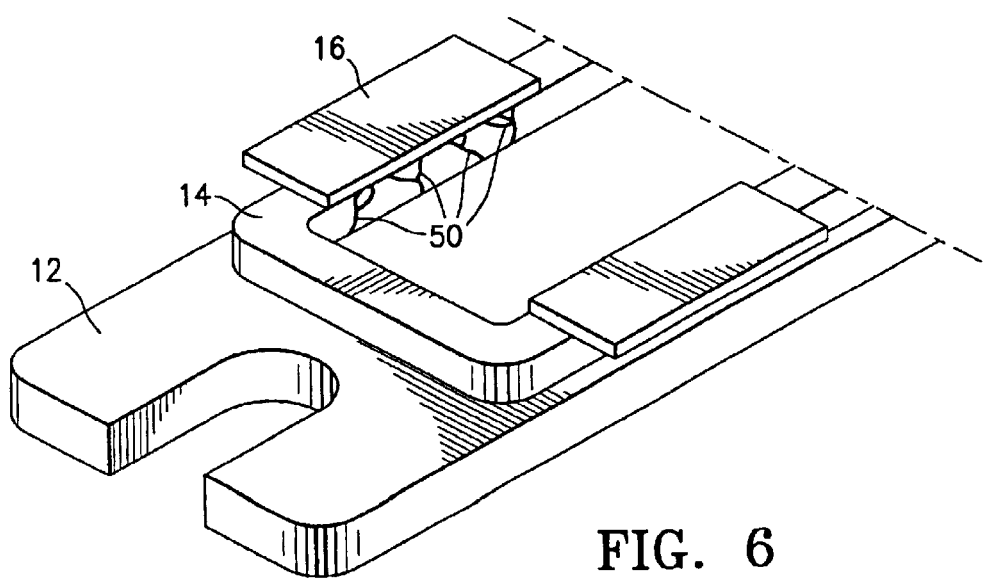
FIG. 6 is a perspective view of a portion of the semiconductor package of FIG. 1 showing the manner in which silver deposits are formed across the window frame when moisture is present and bias voltage is applied and silver-based filler metals of the prior art are used to bind the flange and the leads to the window frames.

This process is shown in FIG. 5, which shows the portion of the layer of moisture 42 extending from the lead 16 over the filler metal 32, the dielectric material of the window frame 14, and the filler metal 34, to the flange 12. The filler metal 32 contains silver. At an adjacent first region 44 of the layer of moisture 42, the silver in contact with the moisture is ionized into $Ag^+$. At a second region 46 adjacent the window frame 14, the ionized silver $Ag^+$ is attracted to the negatively biased heatsink flange 12. At a third region 48 of the layer of moisture 42 adjacent the filler metal 34, the ionized silver $Ag^+$ is transformed into Ag as it comes into contact with the heatsink flange 12. The silver is deposited as a pure metal, and the effect is cumulative. As more silver deposits on itself, the effective distance between the cathode formed by the heatsink flange 12 and the anode formed by the leads 16 is reduced. Eventually, a complete bridge of silver is formed between the flange 12 and the leads 16, electrically shorting the semiconductor package 10. These so-called silver dendrites are typically formed at various different locations along the inner wall of the window frame 14 within the opening 18. This is shown in FIG. 6, where several of the silver dendrites 50 are illustrated.

Figure 7:
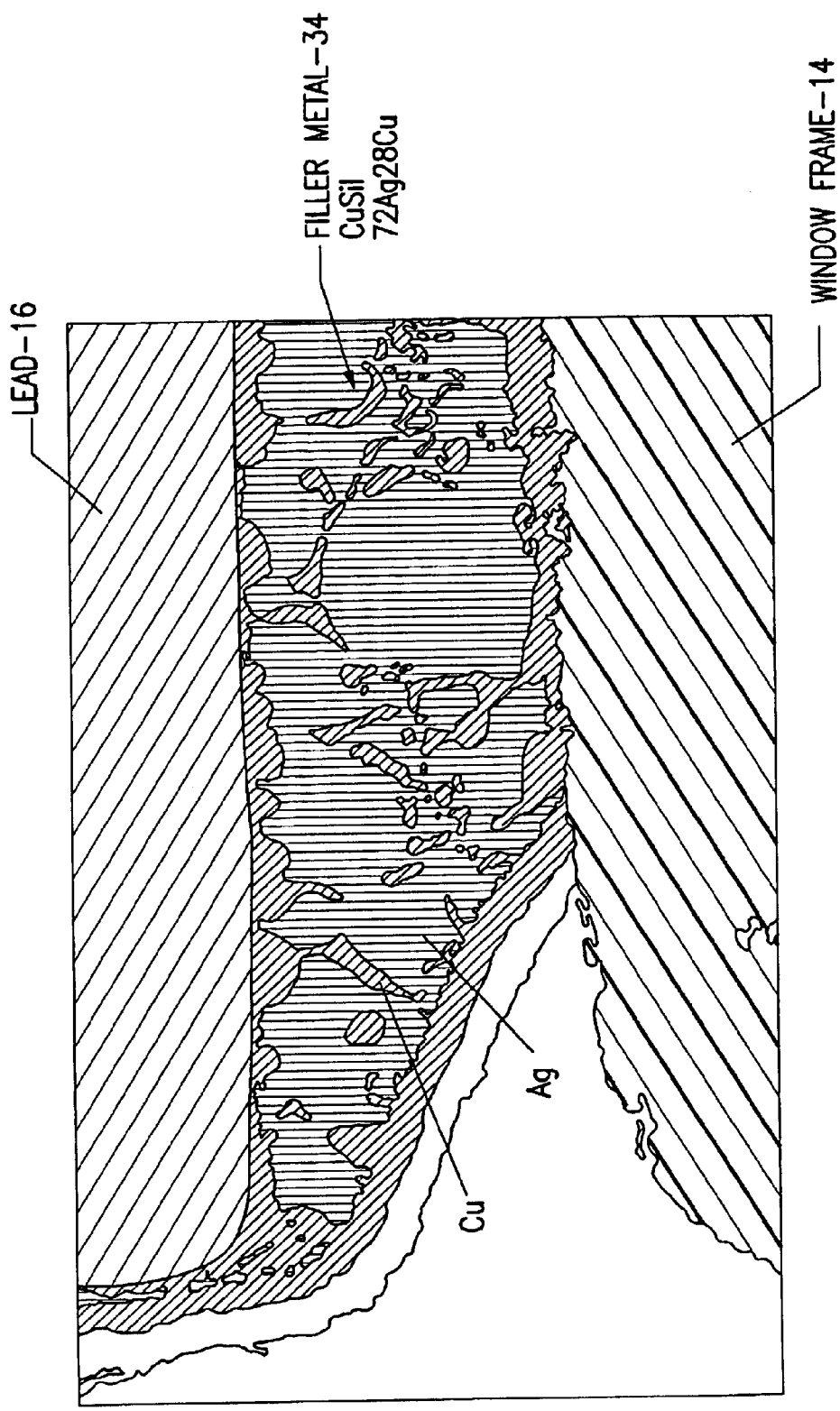
FIG. 7 is a cross-sectional view of the lead/window frame interface of the semiconductor package of FIG. 1 showing the manner in which silver-based filler metals of the prior art segregate into silver and copper to produce unwanted silver migration.

FIG. 7 is an enlarged cross-sectional view of the lead/window frame interface in which the filler metal 34 is CuSil (72Ag28Cu). As shown in FIG. 7, the filler metal 34 has solidified into rich pockets of silver (Ag) and copper (Cu). Pockets of the silver which are close to the surface of the filler metal 34 are easily ionized and eventually form the unwanted silver dendrites 50.

In accordance with the invention, semiconductor packages and other electronic packages such as the package 10 are assembled using a filler metal comprised of gold, silver and copper. The filler metal is a solid solution structure in which the constituent metals are atomically dispersed. With filler metals of this type, the potential for the silver to ionize in the presence of moisture and a potential difference supplied to the component parts of the package is eliminated or at least substantially reduced. A preferred form of the filler metal comprises 60Au20Cu20Ag.

Figure 8:
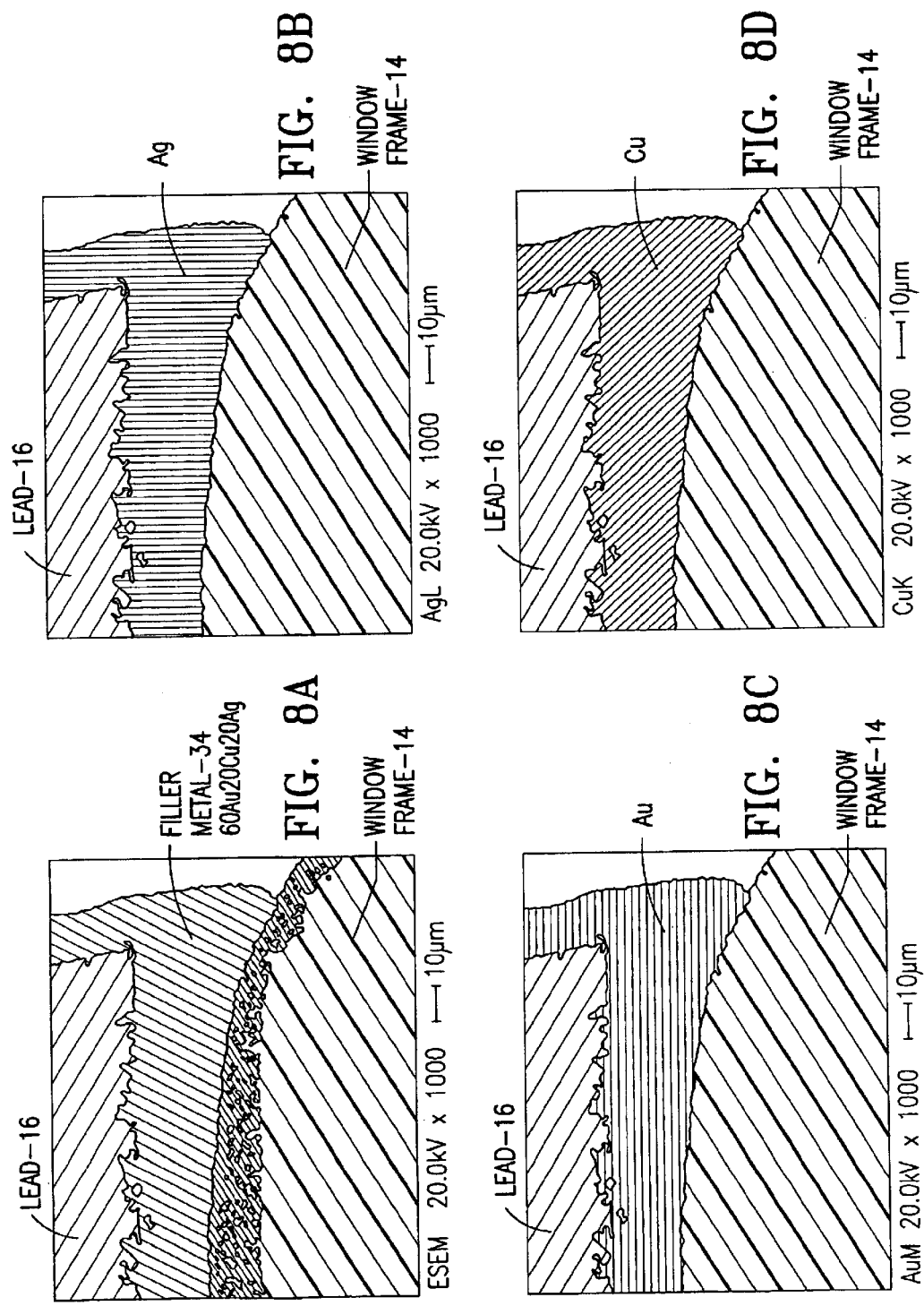
FIGS. 8A–8D are cross-sectional views of the lead/window frame interface, similar to that of FIG. 7, but showing a filler metal in accordance with the invention and the constituent parts thereof.

FIG. 8A is an enlarged cross-sectional view of the lead/window frame interface in which the filler metal 34 comprises 60Au20Cu20Ag. As will be seen in FIG. 8A, there are no rich pockets of silver, copper or gold. The three components of the filler metal are generally uniformly distributed within the filler metal structure, suggesting a type of substitutional alloy. In the case of a substitutional alloy, the components of the alloy are homogeneously mixed at an atomic level. The sectional views of FIGS. 8B, 8C and 8D show the silver (Ag), the gold (Au), and the copper (Cu) respectively. Again, the three components of the filler metal are uniformly distributed within the filler metal structure, as so illustrated.

The reasons for the favorable result illustrated in FIGS. 8A–8D are not entirely clear. It may be that the silver within the substitutional alloy is more difficult to ionize because of atomic attraction to the copper and gold components. It may also be that the mono-layer of silver ions at the surface of the filler metal is able to ionize, so that after the very small amount of silver on the surface is removed, a gold/copper layer acts as a barrier to prevent further silver ionization. In any event, solid solution structures which are atomically dispersed, such as 60Au20Ag20Cu have been found to virtually eliminate the silver migration problems of the filler metals previously used.

The favorable results shown and described in connection with FIGS. 8A–8D occur when the filler metal 34 is comprised of 60Au20Cu20Ag and the lead 16 is positively biased. The filler metal 32 between the window frame 14 and the flange 12 can be comprised of CuSil. In the event that the lead 16 is negatively biased, then silver migration is greatly reduced or eliminated if the filler metal 32 is comprised of 60Au20Ag20Cu. In that event, the filler metal 34 may be comprised of CuSil.

Figure 9:
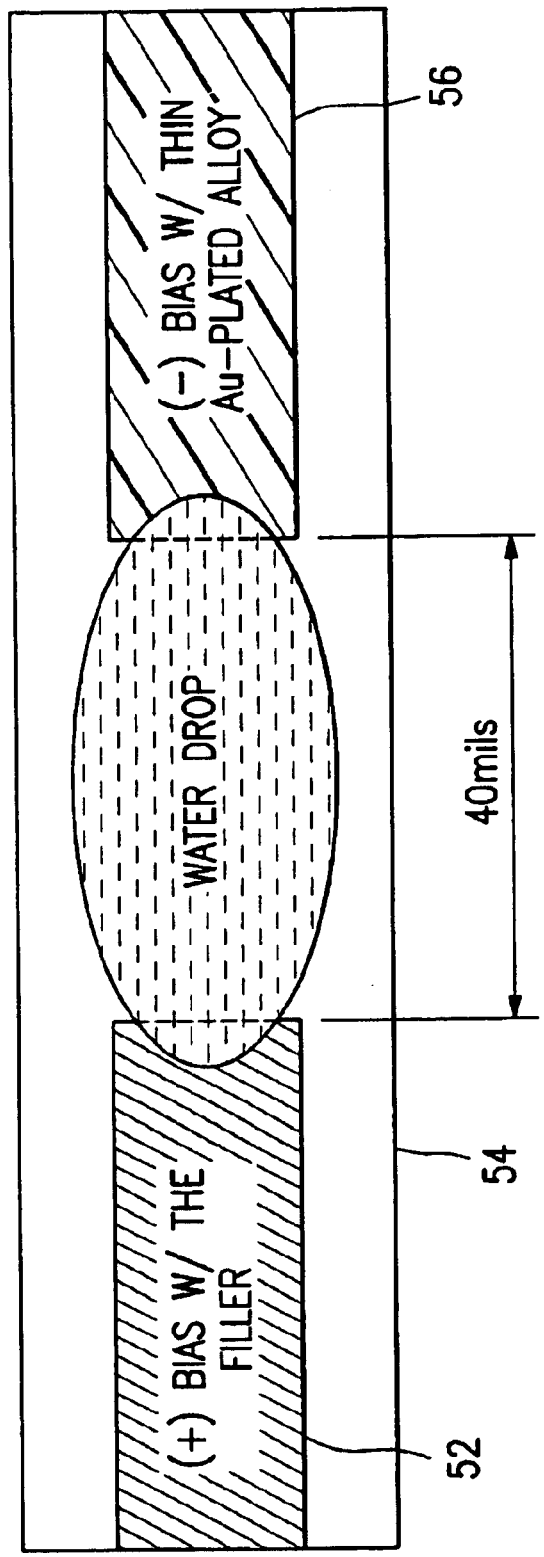
FIG. 9 is a diagrammatic illustration of a test setup for evaluating the ionization potential of various filler metals.

To further confirm the results in accordance with the invention, a series of tests was conducted. As shown in FIG. 9, an element 52 of filler metal to be tested was mounted on a dielectric substrate 54 so that an end thereof was spaced 40 mils from a gold standard 56. A drop of distilled water was placed across the gap so that it bridged the space between the element of filler metal 52 and the gold standard 56. A voltage bias was applied across the components 52 and 56, as shown. Three different filler metals (100Ag, 72Ag28Cu, and 60Au20Ag20Cu) were then tested, as shown in Table 1.

TABLE 1

|  | 5 volts | 10 volts | 20 volts | 30 volts |
|---|---|---|---|---|
| 100 Ag | 9 min 45 s | 1 min 45 s | 55 s | n/a |
| 72Ag28Cu | 18 min | 4 min 45 s | 3 min 40 s | 2 min |
| 60Au20Ag20Cu | None (>60 min) | None (>60 min) | None (>60 min) | None (>60 min) |

In addition to the different filler metals, Table 1 illustrates four different voltages (5 volts, 10 volts, 20 volts and 30 volts) that were applied. The total time required for the silver in the filler metal to ionize, migrate, deposit and bridge the arrangement shown in FIG. 9 is also illustrated in Table 1. As shown in Table 1, the time for shorting to occur ranged from nine minutes and 45 seconds at 5 volts to 55 seconds at 20 volts, when the filler metal was pure silver (100 Ag). In the case of the conventional and widely used alloy CuSil (72Ag28Cu), the time until shorting ranged from 18 minutes in the case of 5 volts to 2 minutes in the case of 30 volts. In the case of 60Au20Ag20Cu, which is the preferred alloy in accordance with the invention, no shorting occurred at any of the voltages shown. In each case, the voltage was applied for more than 60 minutes. At approximately 60 minutes, most of the water had evaporated, leaving no path for the silver to travel.

What is claimed is:

1. An electronic package comprising at least two parts adapted to have an electrical potential applied therebetween and having a filler alloy disposed between and binding the two parts together, the filler alloy consisting of a solid solution of gold, silver and copper in which the gold, silver and copper are atomically dispersed within the filler alloy.

2. An electronic package comprising at least two parts adapted to have an electrical potential applied therebetween and having a filler alloy disposed between and binding the two parts together, the filler alloy comprising 60Au20Ag20Cu.

3. A semiconductor package comprising a flange, a window frame, at least one lead and a filler alloy, the filler alloy binding the window frame to the flange and to the at least one lead and consisting of a solid solution of gold, silver and copper in which the gold, silver and copper are atomically dispersed within the filler alloy.

4. A semiconductor package in accordance with claim 3, further comprising a plurality of leads bound to the window frame opposite the flange, a die mounted on the flange within an opening in the window frame and a lid mounted over the die and attached to the plurality of leads and to the window frame along a peripheral edge thereof.

5. A semiconductor package comprising a flange, a window frame, at least one lead and a filler alloy, the filler alloy binding the window frame to the flange and to the at least one lead and comprising 60Au20Ag20Cu.

6. A semiconductor package comprising a heatsink flange having a surface thereon, a window frame having an opening therein between opposite first and second surfaces thereof, and a plurality of leads, the first surface of the window frame being coupled to the surface of the flange by a filler alloy and the plurality of leads being coupled to the second surface of the window frame by the filler alloy, at least one die mounted on the flange within the opening in the window frame and wire bonded to the plurality of leads, and a lid having a peripheral edge thereof coupled to the leads and to the second surface of the window frame opposite the flange by epoxy, wherein the filler alloy consists of 60Au20Ag20Cu.

* * * * *